United States Patent
Maejima et al.

(10) Patent No.: US 8,094,501 B2
(45) Date of Patent: *Jan. 10, 2012

(54) SEMICONDUCTOR MEMORY DEVICE WHICH INCLUDES MEMORY CELL HAVING CHARGE ACCUMULATION LAYER AND CONTROL GATE

(75) Inventors: Hiroshi Maejima, Milpitas, CA (US); Makoto Hamada, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/848,762

(22) Filed: Aug. 2, 2010

(65) Prior Publication Data

US 2010/0296345 A1 Nov. 25, 2010

Related U.S. Application Data

(63) Continuation of application No. 11/955,831, filed on Dec. 13, 2007, now Pat. No. 7,782,673.

(51) Int. Cl.
*G11C 11/34* (2006.01)

(52) U.S. Cl. ......... 365/185.15; 365/185.27; 365/185.29; 365/218; 365/185.11

(58) Field of Classification Search .............. 365/185.15, 365/185.27, 185.29, 218, 185.11
See application file for complete search history.

(56) References Cited

U.S. PATENT DOCUMENTS

| | | | |
|---|---|---|---|
| 5,297,096 A * | 3/1994 | Terada et al. ............ | 365/185.11 |
| 5,892,715 A * | 4/1999 | Hirata et al. ............ | 365/185.29 |
| 5,978,277 A | 11/1999 | Hsu et al. | |
| 6,125,052 A | 9/2000 | Tanaka | |
| 6,646,916 B2 | 11/2003 | Kamei | |
| 6,831,860 B2 | 12/2004 | Lee et al. | |
| 6,870,771 B2 | 3/2005 | Tomoeda et al. | |
| 7,072,218 B2 | 7/2006 | Fujito et al. | |
| 7,782,673 B2 * | 8/2010 | Maejima et al. ......... | 365/185.15 |
| 2010/0124111 A1 | 5/2010 | Suzuki et al. | |

FOREIGN PATENT DOCUMENTS

JP 11-96783 4/1999

* cited by examiner

*Primary Examiner* — Son Dinh

(74) *Attorney, Agent, or Firm* — Oblon, Spivak, McClelland, Maier & Neustadt, L.L.P.

(57) ABSTRACT

A semiconductor memory device includes memory cells, a source line, a word line, a bit line, and a driver circuit. The memory cells are formed on a semiconductor layer and have a charge accumulation layer and a control gate on the charge accumulation layer. The word line is connected to gate of the memory cell. The bit line is electrically connected to a drain of the memory cell. The source line is electrically connected to a source of the memory cell. The driver circuit varies potential of the semiconductor layer in conjunction with potential of the source line.

20 Claims, 9 Drawing Sheets

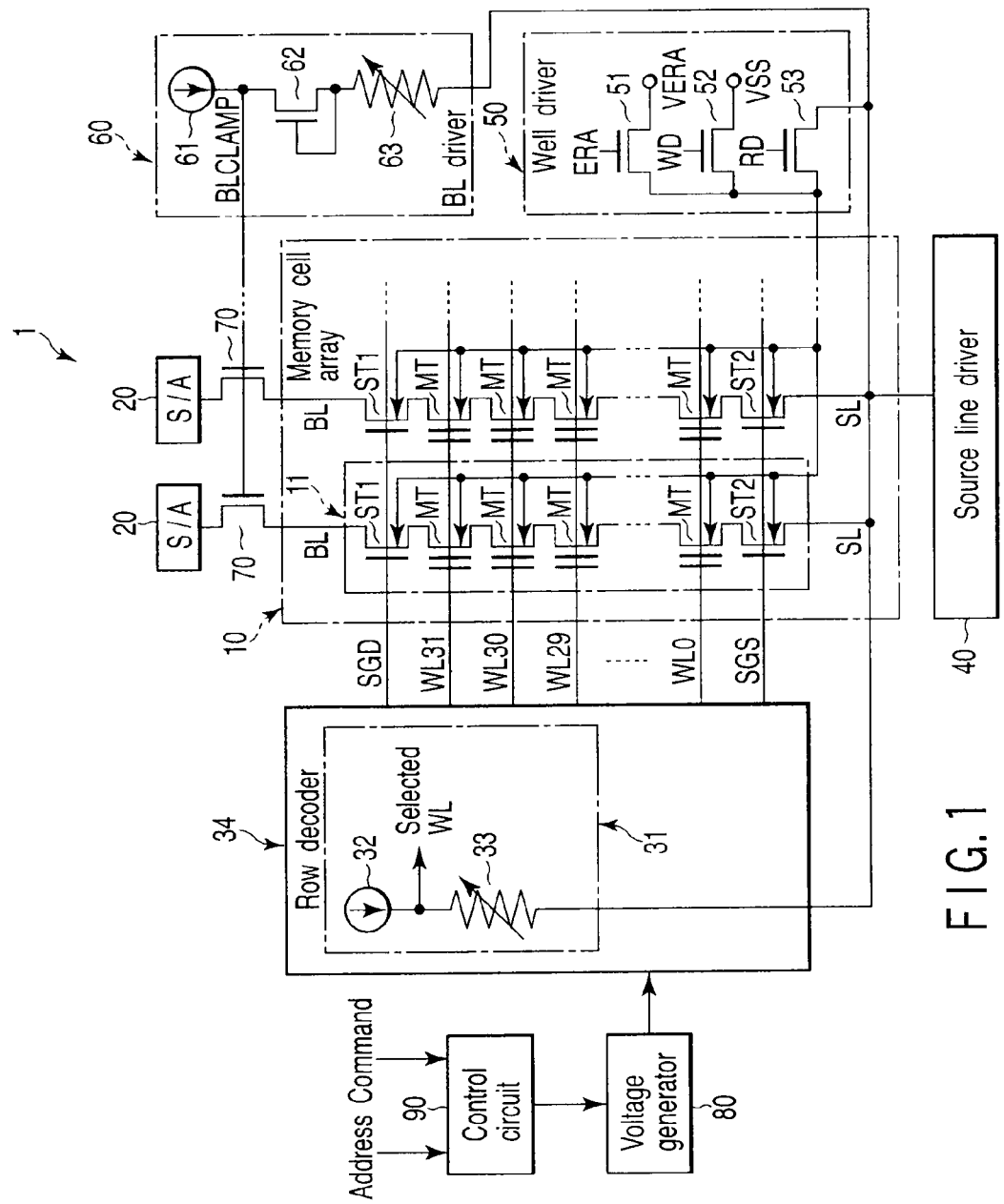
F I G. 1

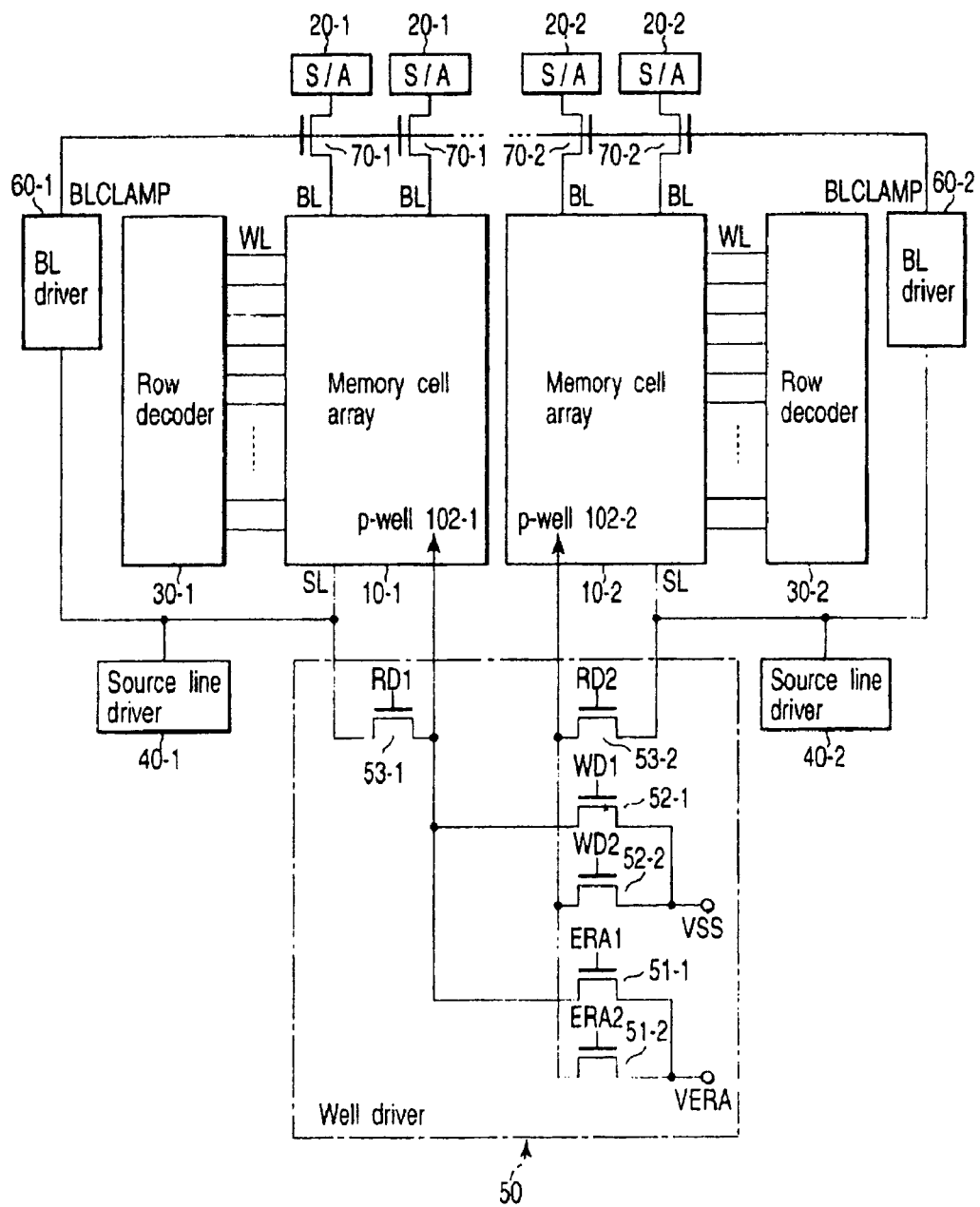
F I G. 8

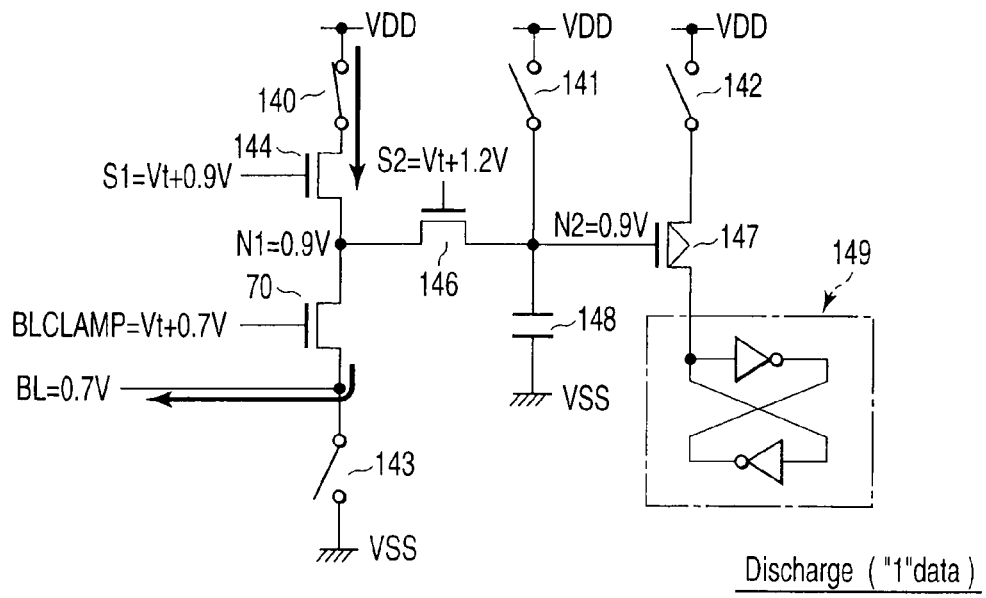
F I G. 1 3
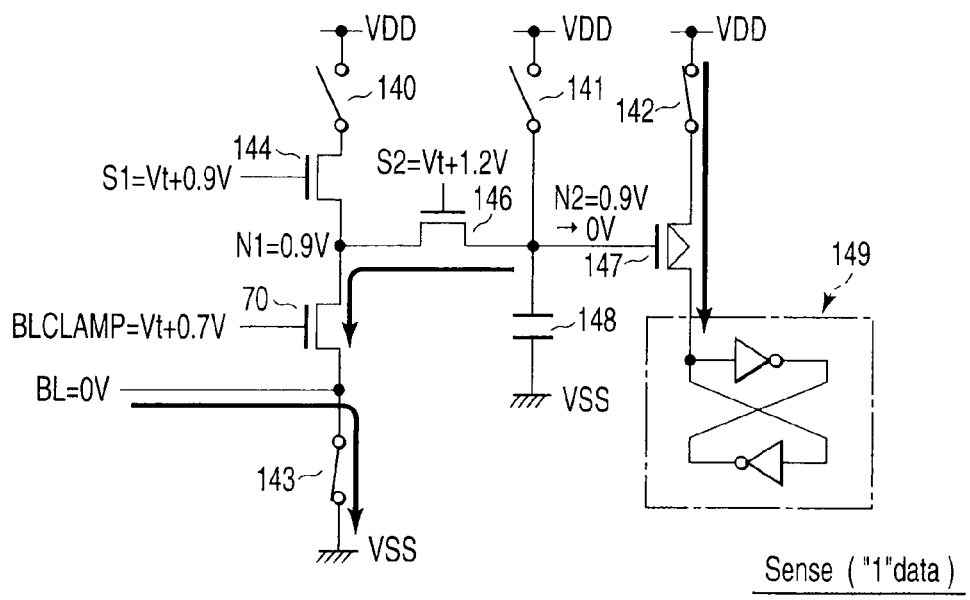
F I G. 1 4

SEMICONDUCTOR MEMORY DEVICE WHICH INCLUDES MEMORY CELL HAVING CHARGE ACCUMULATION LAYER AND CONTROL GATE

CROSS-REFERENCE TO RELATED APPLICATIONS

This application is a continuation of U.S. Ser. No. 11/955,831 filed Dec. 13, 2007, the entire contents of which are incorporated herein by reference.

BACKGROUND OF THE INVENTION

1. Field of the Invention

The present invention relates to a semiconductor memory device. For example, the present invention relates to a semiconductor memory device including memory cells each having a charge accumulation layer and a control gate.

2. Description of the Related Art

Electrically erasable and programmable read-only memories (EEPROMs) are known as nonvolatile semiconductor memories that allow data to be electrically rewritten. NAND flash memories are known as EEPROMs that allow an increase in capacity and degree of integration.

A flash memory senses data depending on whether a memory cell is turned on or off when a voltage is applied to a corresponding word line. Turning on the memory cell allows current to flow from a corresponding bit line to a corresponding source line. This raises the potential of the source line.

A NAND flash memory reads data from a plurality of memory cells at a time. Thus, the level of a rise in the potential of the source line varies depending on the number of memory cells turned on. A particularly high rise in potential reduces the difference in potential between the source line and the bit line. This may cause erroneous data reading. Thus, for example, Jpn. Pat. Appln. KOKAI Publication No. H11-96783 discloses a method of varying the potential of the word line depending on the potential of the source line.

However, this method may not be sufficient as measures for preventing possible erroneous data reading.

SUMMARY OF THE INVENTION

A semiconductor memory device according to an aspect of the present invention includes:

a plurality of memory cells formed on a semiconductor layer and having a charge accumulation layer and a control gate formed on the charge accumulation layer;

a word line connected to the control gate of the memory cell;

a bit line electrically connected to a drain of the memory cell;

a source line electrically connected to a source of the memory cell; and a driver circuit varying potential of the semiconductor layer in conjunction with potential of the source line.

BRIEF DESCRIPTION OF THE DRAWINGS

FIG. 1 is a block diagram of a flash memory according to a first embodiment of the present invention;

FIGS. 4 to 6 are circuit diagrams showing the NAND cell and a well driver according to the first embodiment of the present invention, wherein FIG. 4 shows data programming, FIG. 5 shows data reading, and FIG. 6 shows data erasure;

FIG. 8 is a block diagram of a flash memory according to a second embodiment of the present invention;

FIGS. 10 to 14 are circuit diagrams of a sense amplifier provided in a flash memory according to a third embodiment of the present invention.

DETAILED DESCRIPTION OF THE PREFERRED EMBODIMENTS

First Embodiment

Figure 2:
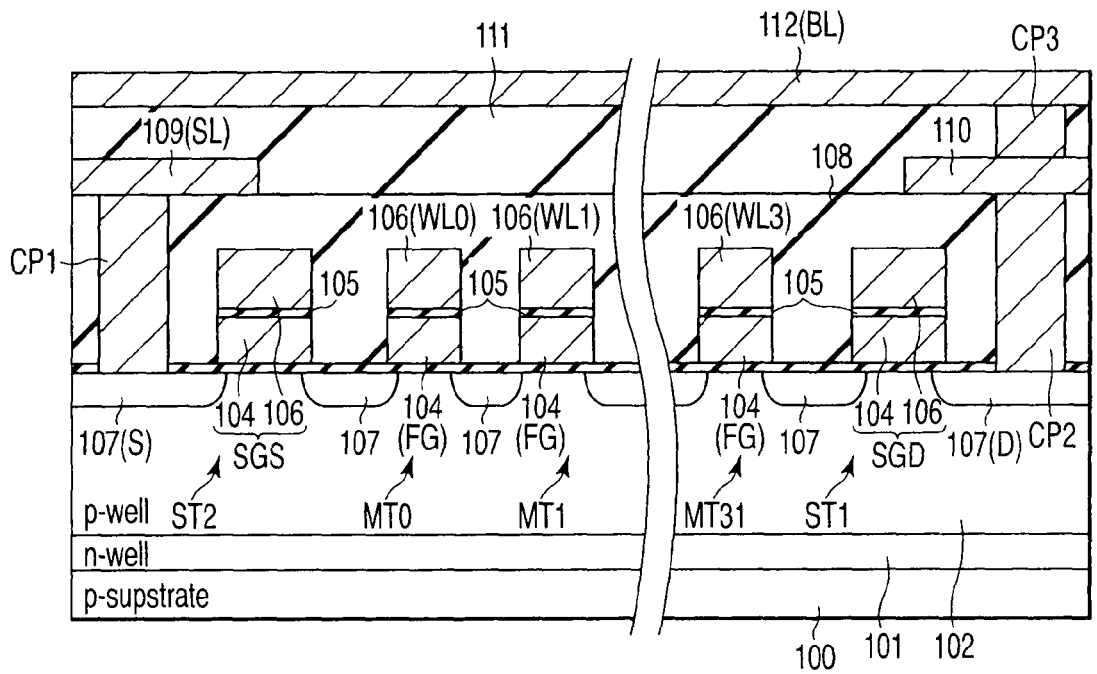
FIG. 2 is a sectional view of a NAND cell according to the first embodiment of the present invention.

Description will be given of a semiconductor memory device according to a first embodiment of the present invention. FIG. 1 is a block diagram of a NAND flash memory according to the present embodiment.

As shown in FIG. 1, a NAND flash memory 1 includes a memory cell array 10, sense amplifiers 20, a row decoder 30, a source line driver 40, a well driver 50, a bit line driver 60, MOS transistors 70, a voltage generator 80, and a control circuit 90.

The memory cell array 10 includes a plurality of memory cell units 11 each having nonvolatile memory cells connected in series. A word line is connected to a gate of each memory cell. A bit line is connected to a drain of a memory cell at one end of the memory cell unit. A source line is connected to a source of a memory line at the other end.

For data reading, each of the sense amplifiers 20 senses and amplifies data read from a memory cell to the bit line. For data writing, the sense amplifier 20 transfers write data to the corresponding bit line.

The row decoder 30 selects a row direction of the memory cell array 10. That is, the row decoder 30 selects a word line.

The source line driver 40 applies a voltage to a source line. For data reading, the source line driver 40 applies a voltage VSS (0 V) to the source line.

The well driver 50 applies a voltage to a well region in which the memory cell array 10 is formed. That is, the well driver 50 applies a back gate bias for the memory cell.

Each of the MOS transistors 70 connects a corresponding bit line and the corresponding sense amplifier 20. That is, each of the MOS transistors 70 has a current path connected to the corresponding bit line at one end and to the corresponding sense amplifier 20 at the other end. Turning on the MOS transistor 70 electrically connects the bit line to the sense amplifier 20.

The bit line driver 60 provides a voltage BLCLAMP to a gate of the MOS transistor 70. The voltage BLCLAMP provided by the bit line driver 60 turns on the MOS transistor 70.

The voltage generator 80 generates various voltages. For example, for data writing, the voltage generator 80 generates a program voltage VPGM (for example, 20 V) and an intermediate voltage VPASS. For data reading, the voltage generator 80 generates a read voltage VCGR and a voltage VREAD. For data erasure, the voltage generator 80 generates an erase voltage VERA (for example, 20 V).

The control circuit 90 receives external addresses and commands. In accordance with the received signal, the control circuit 90 controls the operation of the voltage generator 80 and the like.

Now, the memory cell array 10 will be described in detail with reference to FIG. 1. The memory cell array 10 includes a plurality of memory cell units 11 as previously described. Each of the memory cell units 11 includes, for example, 32 memory cell transistors MT (memory cells) and select transistors ST1 and ST2. The memory cell transistor MT includes a stack gate structure having a charge accumulation layer (for example, a floating gate) formed on a semiconductor substrate with a gate insulating film interposed therebetween and a control gate electrode formed on the floating gate with an inter-gate insulating film interposed therebetween. The number of memory cell transistors MT is not limited to 32, but may be 8, 16, 64, 128, 256, or the like; no limitation is imposed on the number of memory cell transistors MT. The adjacent memory cell transistors MT share a source and a drain. The memory cell transistors MT are arranged so that the current paths of the memory cell transistors MT are connected in series between the select transistors ST1 and ST2. A drain region at one end side of the memory cell transistors MT connected in series is connected to a source region of the select transistor ST1. A source region at the other end side is connected to a drain region of the select transistor ST2.

The control gate electrodes on the memory cell transistors MT in the same row are commonly connected to one of word lines WL0 to WL31. Gates of the select transistors ST1 and ST2 in the same row are commonly connected to select gate lines SGD and SGS, respectively. For simplification of description, the word lines WL0 to WL31 are hereinafter simply referred to as a word line WL. Drains of the select transistors ST1 in the same column in the memory cell array 10 are commonly connected to one of bit lines BL. Sources of the select transistors ST2 are commonly connected to a corresponding source line SL. It is not always needed for both select transistors ST1 and ST2 to be provided, and if the NAND cells can be selected, only either of them may be provided for this semiconductor memory device.

FIG. 1 illustrates only the memory cell unit 11 positioned on one row. However, plural memory cell units 11 on a plurality of rows may be disposed inside the memory cell array 10. In this case, the memory cell units 11 on a same column are connected to the same bit line BL. Data is written into a plurality of memory cell transistors MTs connected to the identical word line WL, at a time, and this writing unit is referred to as a page. Further, a plurality of NAND cells on the same row erase the data therein, at a time, and this erasing unit is called memory block. Back gates of the memory cell transistors MT in the same memory block are connected together. That is, the back gates are formed on the same well region.

FIG. 2 is a sectional view taken along a bit line direction of the NAND cell configured as described above. As shown in the figure, an n-type well region 101 is formed in a surface area of a p-type semiconductor substrate 100. A p-type well region 102 is formed in a surface area of the n-type well region 101. A gate insulating film 103 is formed on the p-type well region 102. Gate electrodes of the memory cell transistor MT and the select transistors ST1 and ST2 are formed on the gate insulating film 103. The gate electrodes of the memory cell transistor MT and select transistors ST1 and ST2 have a polycrystalline silicon layer 104 formed on the gate insulating film 103, an inter-gate insulating film 105 formed on the polycrystalline silicon layer 104, and a polycrystalline silicon layer 106 formed on the inter-gate insulating film 105. The inter-gate insulating film 105 is formed of, for example, a silicon oxide film, or an ON film, an NO film, or an ONO film that is a stack structure of silicon oxide and silicon nitride films, or a stack structure containing any of those films, or a stack structure of a $TiO_2$, $HfO_2$, $Al_2O_3$, $HfAlO_x$, or HfAlSi film and a silicon oxide film or a silicon nitride film. The gate insulating film 103 functions as a tunnel insulating film.

In the memory cell transistor MT, the polycrystalline silicon layer 104 functions as a floating gate (FG). On the other hand, the polycrystalline silicon layers 106 arranged adjacent to each other in a direction orthogonal to the bit line are connected together and function as a control gate electrode (word line WL). In the select transistors ST1 and ST2, the polycrystalline silicon layer 104 and 106 arranged adjacent to each other in the direction of the word lines are connected together. The polycrystalline silicon layers 104 and 106 function as the select gate lines SGS and SGD. The polycrystalline silicon layer 104 alone may be function as a select gate line. In this case, the potentials of the polycrystalline silicon layers 106 in the select transistors ST1 and ST2 are fixed or in a floating state. An $n^+$-impurity diffusion layer 107 is formed in a surface of the semiconductor substrate 100 which is positioned between the gate electrodes. The impurity diffusion layer 107 is shared by the adjacent transistors and functions as a source (S) or a drain (D). The area between the source and drain arranged adjacent to each other functions as a channel region in which electron moves. The gate electrodes, the impurity diffusion layers 107, and the channel region form the MOS transistor serving as the memory cell transistors MT and the select transistors ST1 and ST2.

An inter-layer insulating film 108 is formed on the semiconductor substrate 100 so as to cover the memory cell transistors MT, and select transistors ST1 and ST2. A contact plug CP1 is formed in the inter-layer insulating film 108 and reaches the impurity diffusion layer (source) 107 in the source-side select transistor ST2. A metal wiring layer 109 is formed on the interlayer insulating film 108 and connected to the contact plug CP1. The metal wiring layer 109 functions as a part of the source line SL. A contact plug CP2 is formed in the inter-layer insulating film 108 and reaches the impurity diffusion layer (drain) 107 in the drain-side select transistor ST1. A metal wiring layer 110 is formed on the interlayer insulating film 108 and connected to the contact plug CP2.

An interlayer insulating film 111 is formed on the inter-layer insulating film 108 so as to cover the metal wiring layers 109 and 110. A contact plug CP3 is formed in the interlayer insulating film 111 and reaches the metal wiring layer 110. A metal wiring layer 112 is formed on the interlayer insulating film 111 and connected to a plurality of the contact plugs CP3. The metal wiring layer 112 functions as the bit line BL.

Figure 3:
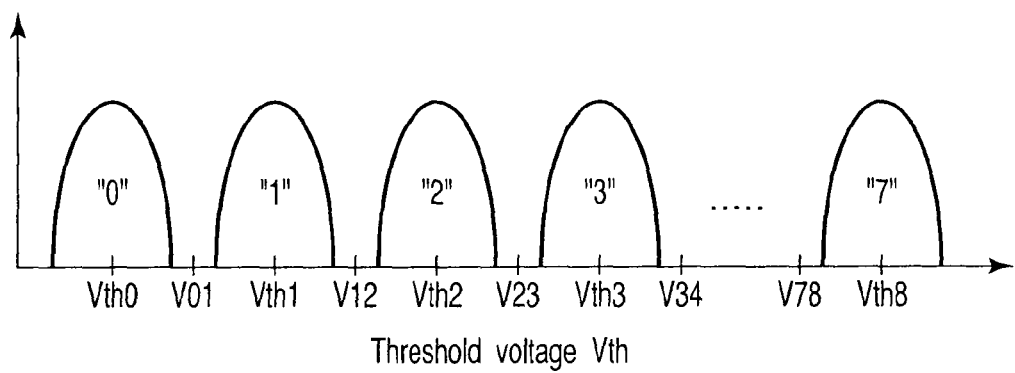
FIG. 3 is a graph showing the possible distribution of the threshold voltage of a memory cell provided in the flash memory according to the first embodiment of the present invention.

The threshold distribution of the memory cell transistor MT will be described with reference to FIG. 3. FIG. 3 is a graph showing a threshold voltage Vth on the abscissa and the presence probability of the memory cell transistor MT on the ordinate.

As shown in FIG. 3, each of the memory cell transistors MT can hold 8 levels of data (3-bit data). That is, the memory cell transistor MT can hold eight types of data "0", "1", "2", "3", . . . , "7", which correspond to the order of increasing threshold voltage Vth. For the threshold voltage Vth0 of "0" data in the memory cell transistor MT, Vth0<V01. For the threshold voltage Vth1 of "1" data, V01<Vth1<V12. For the threshold voltage Vth2 of "2" data, V12<Vth2<V23. For the threshold voltage Vth3 of "3" data, V23<Vth3<V34. For the threshold voltage Vth4 of "4" data, V34<Vth4<V45. For the threshold voltage Vth4 of "4" data, V34<Vth4<V45. For the threshold voltage Vth5 of "5" data, V45<Vth5<V56. For the threshold voltage Vth6 of "6" data, V56<Vth6<V67. The threshold voltage Vth7 of "7" data, V67<Vth7.

The data that can be held by the memory cell transistor MT is not limited to the 8 levels. For example, 2 levels (1 bit data), 4 levels (2 bit data), or 16 levels (4 bit data) may be used.

Now, the row decoder 30 will be described in detail with reference to FIG. 1 again. For data writing and data reading, the row decoder 30 selects any of the word lines WL and applies voltages to the selected word line and unselected word lines. For erasure, the row decoder 30 applies an erase voltage VERA to the p-type well region 102 and a voltage VSS to all the word lines WL. The row decoder 30 further includes a word line driver 31.

For data reading, the word line driver 31 varies the potential of the selected word line WL in conjunction with the source line SL. The word line driver 31 generally includes a current source circuit 32 and a variable resistance element 33. An output node of the current source circuit 32 is connected to one end of the resistance element 33 the other end of which is connected to the source line SL. The potential of the connection node between the current source circuit 32 and the resistance element 33 is applied to the selected word line WL. For example, a read and verify voltage generator 7*a* disclosed in Jpn. Pat. Appln. KOKAI Publication No. H11-96783 may be used as the word line driver 31. All the contents of this reference are incorporated herein by reference.

Now, the well driver 50 will be described below in detail. As shown in FIG. 1, the well driver 50 comprises MOS transistors 51 to 53.

An erase signal ERA is input to a gate of the MOS transistor 51 and has a current path connected to the p-type well region 102 at one. The voltage VERA is applied to the other end of the current path. The erase signal ERA is provided by, for example, the control circuit 90. During an erase operation, the signal ERA is asserted to turn on the MOS transistor 51.

A write signal WD is input to a gate of the MOS transistor 52 and has a current path connected to the p-type well region 102 at one. The voltage VSS is applied to the other end of the current path. The write signal WD is provided by, for example, the control circuit 90. For data programming during a write operation, the signal WD is asserted to turn on the MOS transistor 52.

A read signal RD is input to a gate of the MOS transistor 53 and has a current path connected to the p-type well region 102 at one and connected to the source line SL at the other end of the current path. The read signal RD is provided by, for example, the control circuit 90. During a read operation and for verification during a write operation, the signal RD is asserted to turn on the MOS transistor 53.

Still referring to FIG. 1, the bit line driver 60 will be described in detail. As shown in the figure, the bit line driver 60 generally includes a current source circuit 61, an n-channel MOS transistor 62, and a variable resistance element 63. An output node of the current source circuit 32 is connected to one end of a current path of the MOS transistor 62. The other end of the current path of the MOS transistor 62 is connected to a gate of the MOS transistor 62. That is, the MOS transistor 62 functions as a diode element. One end of the resistance element 63 is connected to the connection node between the other end of the current path of the MOS transistor 62 and the gate of the MOS transistor 62. The other end of the resistance element 63 is connected to the source line SL. The potential of the connection node between the current source circuit 61 and the MOS transistor 62 is provided to a gate of a MOS transistor 70 as a signal BLCLAMP.

Now, description will be given of a write operation, a read operation, and an erase operation in the NAND flash memory configured as described above, focusing on the operation of the well driver 50.

<Write Operation>

First, the write operation will be described. The write operation is performed by repeating a program operation and a verify operation. The program operation generates a potential difference between a control gate and a channel of the memory cell transistor MT and injecting a charge into the charge accumulation layer in accordance with write data. The case where charge is injected into the charge accumulation layer to raise the threshold voltage of the memory cell transistor MT is hereinafter referred to as "0" programming. The case where no charge is injected into the charge accumulation layer to avoid changing the threshold voltage (in other words, the charge injection is set at a level such that held data is prevented from changing to a different level) is hereinafter referred to as "1" programming. The verify operation reads data after the program operation to check whether or not the threshold voltage of the memory cell transistor MT has reached a desired value. The verify operation is basically similar to the read operation. Consequently, in the description of the write operation, only the program operation will be described.

Figure 4:
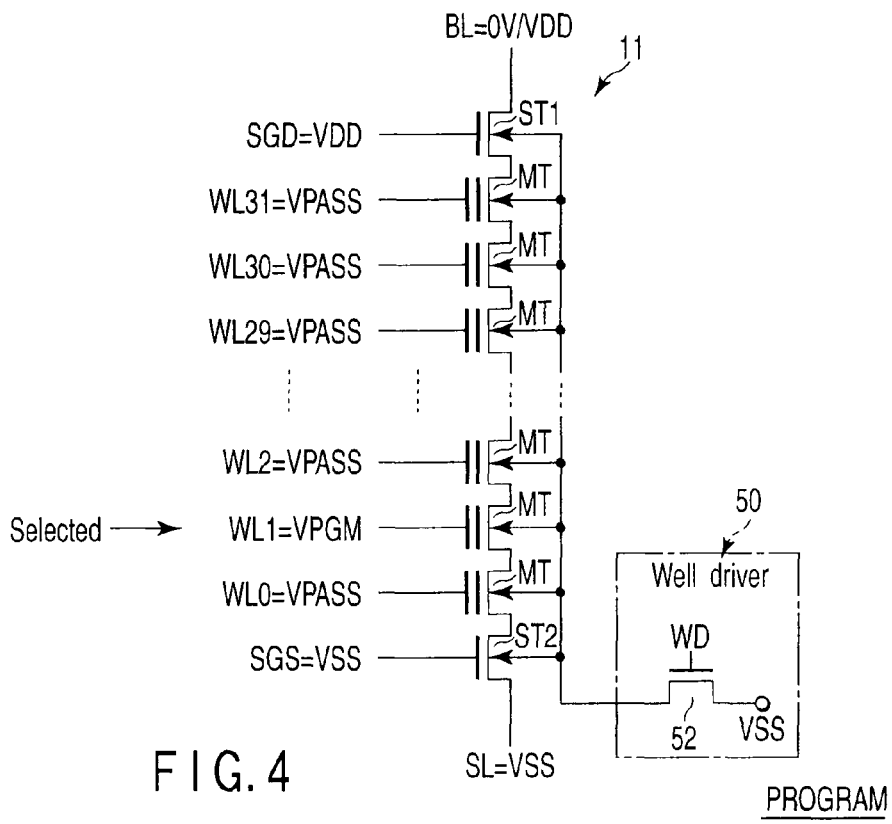

FIG. 4 is a circuit diagram of the NAND cell 11 and the well driver 50 during data programming. In an example described below, the memory cell transistors MT connected to the word line WL1 are programmed.

First, the row decoder 30 selects the word line WL1, and applies the program voltage VPGM to the selected word line WL1. The row decoder 30 applies the voltage VPASS to the unselected word lines WL0 and WL2 to WL31. The row decoder 30 applies the voltage VDD to the select gate line SGD and applies the voltage VSS (0 V) to the select gate line SGS.

The sense amplifier 20 applies 0 V or VDD to the bit lines BL via the current paths of the MOS transistors 70. That is, the voltage VDD as a write voltage is applied to the bit lines BL to which the memory cell transistors MT to be subjected to the "1" programming are connected. The voltage VSS as a write inhibition voltage is applied to the bit lines BL to which the memory cell transistors MT to be subjected to "0" programming are connected.

In the well driver 50, the MOS transistors 51 and 53 are turned off, whereas the MOS transistor 52 is turned on. As a result, the memory cell transistors MT and the select transistors ST1 and ST2 are provided with VSS as a back gate bias.

The voltage VPGM is a high voltage required to inject charge into charge accumulation layer, for example, 20 V. The voltage VPASS enables the memory cell transistor MT to be turned on regardless of the held data. VPASS<VPGM.

As a result, the memory cell transistors MT are turned on to form channels. That is, current paths are formed through the memory cell transistors MT in the memory cell unit 11 and energized. Since 0 V is applied to the select gate line SGS, the select transistor ST2 is in a cutoff state. In contrast, the select transistor ST1 is in an on state or a cutoff state depending on the write data.

To perform the "0" programming, the write voltage (for example, 0 V) is applied to the bit line BL. Thus, the select transistor ST1 is turned on to transfer 0 V provided to the bit line BL to the channels in the memory cell transistors MT. Then, in the memory cell transistors MT connected to the selected word line WL1, the potential difference between the gate and the channel becomes almost equal to VPGM, with charge injected into the charge accumulation layer. This raises the threshold voltage of the memory cell transistor MT to perform the "0" programming.

To perform the "1" programming, a write inhibition voltage VDD (>write voltage) is applied to the bit line to set the select transistor ST1 to the cutoff state. Consequently, the channels in the memory cell transistors MT in the memory cell unit 11 are set to float electrically. Coupling with the gate voltage (VPGM, VPASS) then raises the potential of the channels. Thus, in the memory cell transistors MT connected to the selected word line WL1, the potential difference between the gate and channel is insufficient. This prevents charge from being injected into the charge accumulation layer (the amount of charge injected into the charge accumulation layer is insufficient to change the held data). As a result, the threshold voltage of the memory cell transistors MT remains unchanged to allow the "1" programming to be performed.

<Read Operation>

Figure 5:
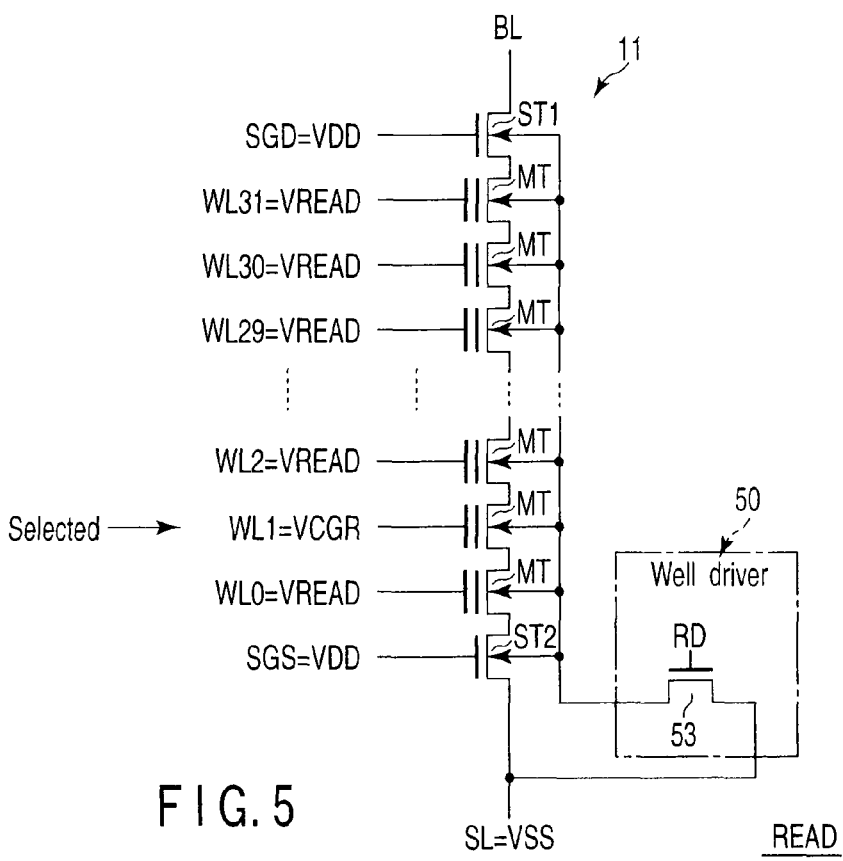

Now, the data read operation will be described. The verify operation is similar to the read operation described below. FIG. 5 is a circuit diagram of the NAND cell 11 and the well driver 50 during data programming. In an example described below, the memory cell transistors MT connected to the word line WL1 are subjected to reading.

First, the sense amplifier 20 precharges the bit lines BL via the current paths of the MOS transistors 70.

The row decoder 30 selects the word line WL1, and applies the read voltage VCGR to the selected word line WL1. The row decoder 30 applies the voltage VREAD to the unselected word lines WL0 and WL2 to WL31. The row decoder 30 applies the voltage VDD to the select gate line SGD and the select gate line SGS.

In the well driver 50, the MOS transistors 51 and 52 are turned off, whereas the MOS transistor 53 is turned on. As a result, the back gates of the memory cell transistors MT and the select transistors ST1 and ST2 are electrically connected to the source line SL. That is, the back gate bias varies depending on the potential of the source line SL.

The voltage VREAD turns on the memory cell transistors MT regardless of the held data. The voltage VCGR is applied to the memory cell transistors that are reading targets and varies depending on the data to be read. For example, the voltage VCGR is set to V01 to read "0" data and set to V12 to read "1" data. The voltage applied to the select gate lines SGD and SGS enables the select transistors ST1 and ST2 to be turned on.

As a result, the memory cell transistors MT connected to the unselected word lines WL0 and WL2 to WL31 are turned on to form channels. The select transistors ST1 and ST2 are also turned on.

When holding data corresponding to a threshold lower than the voltage VCGR, each of the memory cell transistors MT connected to the select word line WL1 is turned on. The bit line BL is electrically connected to the source line SL. That is, current flows from the bit line BL to the source line SL. On the other hand, when holding data corresponding to a threshold equal to or higher than the voltage VCGR, each of the memory cell transistors MT connected to the select word line WL1 is turned off. The bit line is electrically disconnected to the source line. That is, no current flows from the bit line BL to the source line SL.

<Erase Operation>

Now, the data erase operation will be described.

Figure 6:
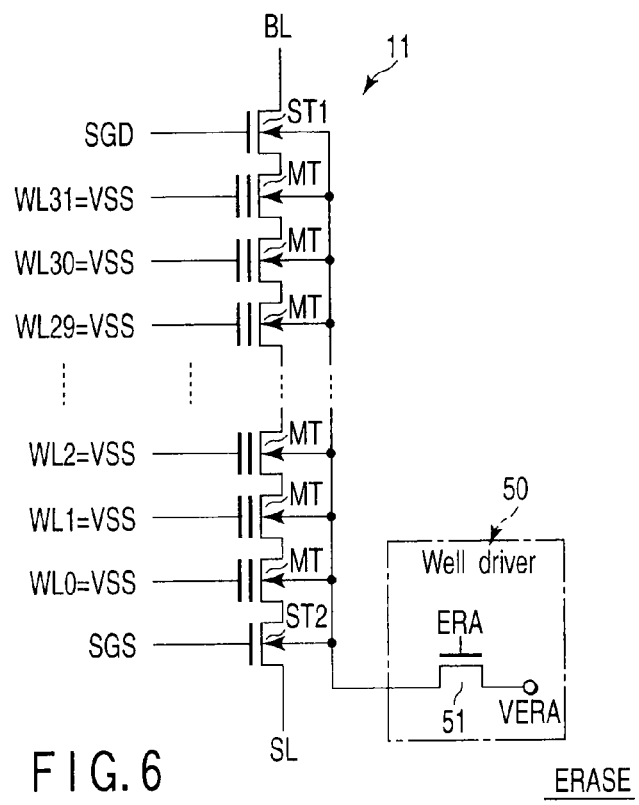

FIG. 6 is a circuit diagram of the NAND cell 11 and the well driver 50 during data erasing.

The row decoder 30 applies the voltage VSS to all the word lines WL0 to WL31. The row decoder 30 further sets the select gate lines SGD and SGS to, for example, float electrically.

The bit lines BL and the source lines SL are also set to float electrically.

In the well driver 50, the MOS transistors 52 and 53 are off, whereas the MOS transistor 51 is turned on. As a result, the erase voltage VERA is applied to the memory cell transistors MT and the select transistors ST1 and ST2 as a back gate bias.

As a result, a potential difference occurs between the gate of each of the memory cell transistors MT and the p-type well region 102. Charge is thus emitted from the floating gate to the well region 102. Thus, data is erased from all the memory cell transistors MT in the same memory block. The data erasure sets the threshold of each of the memory cell transistors MT to a negative value.

As described above, the NAND flash memory according to the memory cell transistor MT exerts an effect (1).

(1) The adverse effect of a variation of the potential of the source line can be inhibited to improve the operational reliability of the NAND flash memory (part 1).

As described above in the BACKGROUND section, a known method varies the potential of the word line in conjunction with the potential of the source line. This technique can ensure the potential difference between the word line and the source line to accurately read data even with a variation in the potential of the source line.

However, even this technique cannot correct the dependence of the memory cell transistor MT on the back gate bias. That is, the potential difference VBS between the back gate (well region) and source of the memory cell transistor MT is affected by a variation in the potential of the source line SL. For example, if the potential of the source line SL rises by 300 mV, an back bias effect varies the threshold voltage of the memory cell transistor MT by about 30 mV.

In this connection, with the configuration according to the present embodiment, the well driver 50 includes the MOS transistor 53, which electrically connects the source line SL to the p-type well region 102 (back gate), in which the memory cell array 10 is formed. During the data read operation and during the verification, the MOS transistor 53 short-circuits the well region 102 and the source line SL. In other words, during the read operation, the well driver 50 makes the potential of the well region 102 equal to the potential finally reached by the source line SL by passing current from the bit line BL to the source line SL via the memory cell transistor MT.

Consequently, the present embodiment can minimize the adverse effect of the variation in the potential of the source line SL on the potential difference VBS. That is, the variation in threshold voltage caused by the back bias effect can be inhibited. This makes it possible to prevent possible erroneous data reading, improving the operational reliability of the NAND flash memory. The present embodiment further reduces the adverse effect of the variation in the potential of the source line SL on the word line and the back gate to enable a reduction in the distribution width of data. More specifically, in the threshold distribution shown in FIG. 3, the possible threshold voltage range of each data can be reduced. This enables a reduction in the voltage required for data programming or reading.

Moreover, the configuration according to the present embodiment has the bit line driver 60. The bit line driver 60 varies the potential of the signal BLCLAMP in conjunction with the source line SL. In other words, the potential of the bit line BL is varied in conjunction with the source line SL. As a result, the potential of the bit line BL also becomes unlikely to be affected by the variation in the potential of the source line SL. This also contributes to preventing possible erroneous reading and reducing the threshold distribution width.

Figure 7:
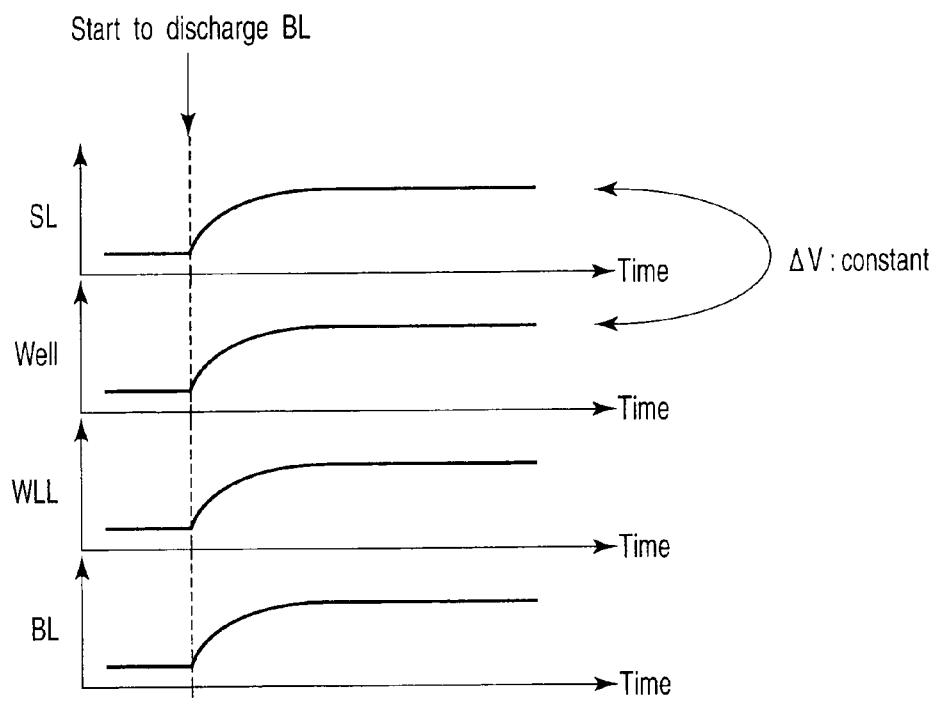
FIG. 7 is a graph showing variations in the potentials of a source line, a word line, and a bit line in the flash memory according to the first embodiment of the present invention.

FIG. 7 is a timing chart showing temporal variations in the potentials of the source line SL, the well region 102, the word line WL, and the bit line BL (or the signal BLCLAMP) during the reading operation in the NAND flash memory 1 according to the present embodiment. As shown in FIG. 7, starting discharging of the bit line BL raises the potential of the source line SL. The configuration according to the present embodiment, the potentials of the well region 102, the word line WL, and the bit line BL vary in the same manner as the source line SL. In particular, the potential difference between the source line SL and the well region 102 is almost fixed, and the potentials of the source line SL and the well region 102 are almost the same.

Second Embodiment

Now, description will be given of a semiconductor memory device according to a second embodiment of the present invention. The present embodiment corresponds to the first embodiment applied to a NAND flash memory including a plurality of memory cell arrays. FIG. 8 is a block diagram of a partial area of a NAND flash memory according to the present embodiment.

As shown in FIG. 8, a NAND flash memory 1 includes memory cell arrays 10-1 and 10-2, sense amplifiers 20-1 and 20-2, row decoders 30-1 and 30-3, source line drivers 40-1 and 40-2, the well driver 50, bit line drivers 60-1 and 60-2, and MOS transistors 70-1 and 70-2. The voltage generator 80 and the control circuit 90 are not shown in FIG. 8 but are similar to those in the first embodiment.

The memory cell arrays 10-1 and 10-2 have a configuration similar to that of the memory cell array 10 described in the first embodiment. However, the memory cell arrays 10-1 and 10-2 are formed on the different p-type well regions 102 and electrically separated from each other. The well regions 102 on which the memory cell arrays 10-1 and 10-2 are formed are hereinafter referred to as well regions 102-1 and 102-2, respectively. The word line WL in the memory cell array 10-1 is also electrically separated from the word line in the memory cell array 10-2. This also applies to the source line SL.

The sense amplifiers 20-1 and 20-2 have a configuration similar to that of the sense amplifier 20, described in the first embodiment. The sense amplifier 20-1 is connected to the memory cell array 10-1 via the MOS transistor 70-1. The sense amplifier 20-2 is connected to the memory cell array 10-2 via the MOS transistor 70-2.

The row decoders 30-1 and 30-2 have a configuration similar to that of the row decoder 30, described in the first embodiment. The row decoder 30-1 performs a select operation on the memory cell array 10-1. The row decoder 30-2 performs the select operation on the memory cell array 10-2.

The source line drivers 40-1 and 40-2 have a configuration similar to that of the source driver 40, described in the first embodiment. The source line drivers 40-1 and 40-2 provide voltages to the source lines of the memory cell arrays 10-1 and 10-2, respectively.

The bit line drivers 60-1 and 60-2 have a configuration similar to that of the bit line driver 60, described in the first embodiment. The bit line drivers 60-1 and 60-2 generate the voltage BLCLAMP in accordance with the source lines SL of the memory cell arrays 10-1 and 10-2, respectively.

Gates of the MOS transistors 70-1 and 70-2 are supplied with the signal BLCLAMP from the bit line drivers 60-1 and 60-2, respectively. That is, the signal BLCLAMP input to the gate of the MOS transistor 70-1 varies in conjunction with the source line of the memory cell array 10-1. The signal BLCLAMP input to the gate of the MOS transistor 70-2 varies in conjunction with the source line of the memory cell array 10-2.

Now, the well driver 50 will be described. The well driver 50 includes MOS transistors 51-1 to 53-1 and 51-2 to 53-2.

The MOS transistor 51-1 has a gate to which an erase signal ERA1 is input, and a current path connected to the p-type well region 102-1 at one end, with the voltage VERA applied to the other end of the current path. The erase signal ERA1 is asserted to erase data from the memory cell array 10-1. That is, the MOS transistor 51-1 applies the voltage VERA to the well region 102-1 to erase the data from the memory cell array 10-1.

The MOS transistor 51-2 has a gate to which an erase signal ERA2 is input, and a current path connected to the p-type well region 102-2 at one end, with the voltage VERA applied to the other end of the current path. The erase signal ERA2 is asserted to erase data from the memory cell array 10-2. That is, the MOS transistor 51-2 applies the voltage VERA to the well region 102-2 to erase the data from the memory cell array 10-2.

The MOS transistor 52-1 has a gate to which a write signal WD1 is input, and a current path connected to the p-type well region 102-1 at one end, with the voltage VSS applied to the other end of the current path. The write signal WD1 is asserted to perform the write operation on the memory cell array 10-1. That is, the MOS transistor 52-1 applies the voltage VSS to the well region 102-1 to perform the write operation on the memory cell array 10-1.

The MOS transistor 52-2 has a gate to which a write signal WD2 is input, and a current path connected to the p-type well region 102-2 at one end, with the voltage VSS applied to the other end of the current path. The write signal WD2 is asserted to perform the write operation on the memory cell array 10-2. That is, the MOS transistor 52-2 applies the voltage VSS to the well region 102-2 to perform the write operation on the memory cell array 10-2.

The MOS transistor 53-1 has a gate to which a read signal RD1 is input, and a current path connected to the p-type well region 102-1 at one end and to the source line SL of the memory cell array 10-1 at the other end. The read signal RD1 is asserted to perform the read operation on the memory cell array 10-1. That is, the MOS transistor 53-1 short-circuits the well region 102-1 and the source line SL of the memory cell array 10-1 to perform the read operation on the memory cell array 10-1.

The MOS transistor 53-2 has a gate to which a read signal RD2 is input, and a current path connected to the p-type well region 102-2 at one end and to the source line SL of the memory cell array 10-2 at the other end. The read signal RD2 is asserted to perform the read operation on the memory cell array 10-2. That is, the MOS transistor 53-2 short-circuits the well region 102-2 and the source line SL of the memory cell array 10-2 to perform the read operation on the memory cell array 10-2.

Figure 9:
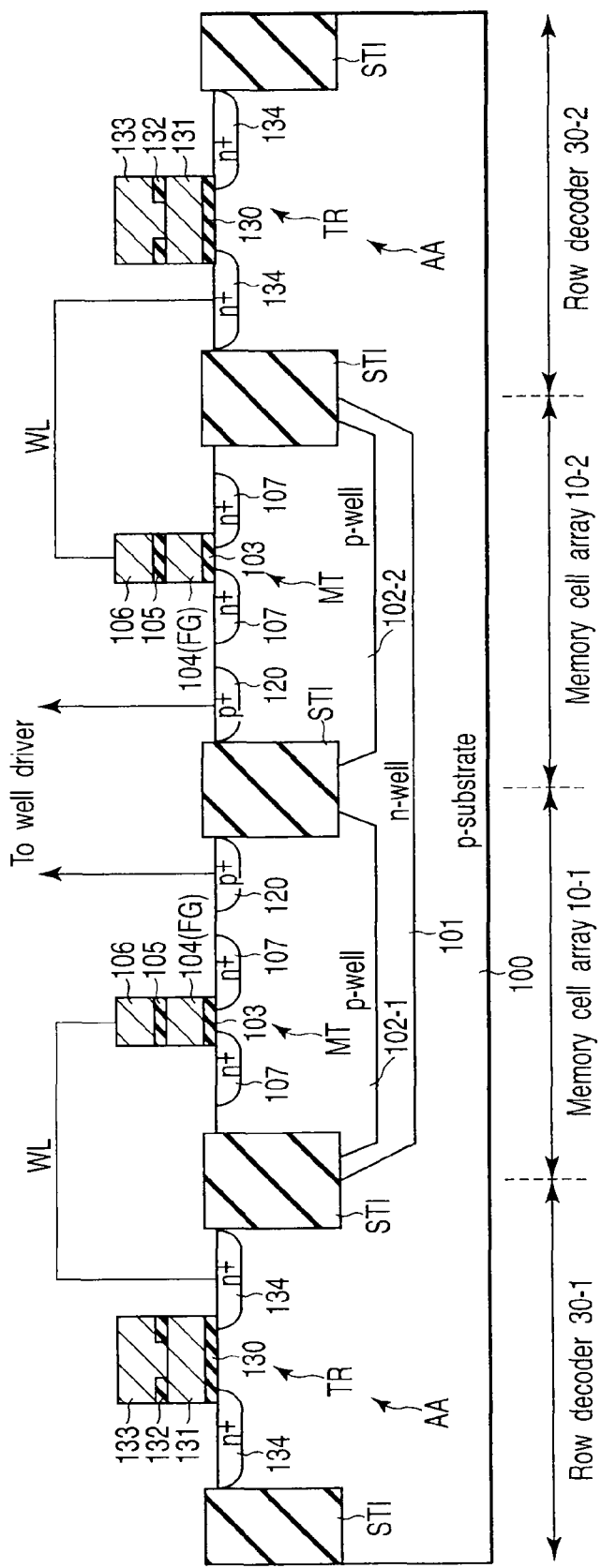
FIG. 9 is a sectional view of the flash memory according to the second embodiment of the present invention.

FIG. 9 is a sectional view of the memory cell arrays 10-1 and 10-2, provided in the NAND flash memory 1 according to the present embodiment as well as peripheral circuit areas. FIG. 9 shows the row decoders 30-1 and 30-2 as peripheral circuits. However, the peripheral circuits are not limited to the row decoders 30-1 and 30-2.

As shown in FIG. 9, the n-type well region 102 is formed in the p-type semiconductor substrate 100. The p-type well regions 102-1 and 102-2 formed in a surface area of n-type well region 102. The well regions 102-1 and 102-2 are electrically separated from each other by, for example, an element isolation area ST1. The memory cell transistors MT and the select transistors ST1 and ST2, described in the first embodiment, are formed on each of the well regions 102-1 and 102-2. A p-type impurity diffusion layer 120 is formed in a surface area of each of the well regions 102-1 and 102-2. Each of the well regions 102-1 and 102-2 is connected to the well driver 50 via the diffusion layer 120.

An element area AA is formed in the semiconductor substrate 100 and electrically separated from the well regions 102-1 and 102-2. For example, a high-withstand-voltage MOS transistor TR included in each of the row decoders 30-1 and 30-2 is formed on the element area AA. The transistor TR includes a gate electrode formed on a gate insulating film 130. The gate insulating film 130 has a film thickness greater than that of the gate insulating film 103 in the memory cell transistor MT. The gate electrode has a stack gate structure similarly to the memory cell transistor MT. That is, the gate electrode includes a polycrystalline silicon layer 131 formed on the gate insulating film 103, an inter-gate insulating film 132 formed on the polycrystalline silicon layer 131, and a polycrystalline silicon layer 133 formed on the inter-gate insulating film 132. The inter-gate insulating film 132 is partly removed to connect the polycrystalline silicon layers 131 and 133 together. An n-type impurity diffusion layer 134 is formed in a surface area of the element area AA and functions as a source and a drain of the MOS transistor TR.

As described above, the configuration described in the first embodiment is also applicable to the NAND flash memory having the plurality of memory cell arrays 10, exerting the effect (1), described in the first embodiment. The present embodiment further exerts an effect (2).

(2) The adverse effect of a variation in the potential of the source line can be inhibited to improve the operational reliability of the NAND flash memory (part 2).

In a NAND flash memory including a plurality of memory cell arrays formed in different well regions, the level of a variation in the source line SL varies with the memory cell array. Thus, in the present embodiment, a well voltage is independently controlled for each memory cell array 10. The potential of the well region 102-1, in which the memory cell array 10-1 is formed, is varied in conjunction with the source line of the memory cell array 10-1. The potential of the well region 102-2, in which the memory cell array 10-2 is formed, is varied in conjunction with the source line of the memory cell array 10-2. This also applies to the voltage of the select word line and the signal BLCLAMP.

The present configuration enables the voltages of the well region 102, the word line WL, and the signal BLCLAMP to be varied depending on the characteristics of each memory cell array 10. As a result, even with a configuration with a plurality of memory cell arrays, the adverse effect of a variation in the potential of the source line can be inhibited.

Third Embodiment

Figure 10:
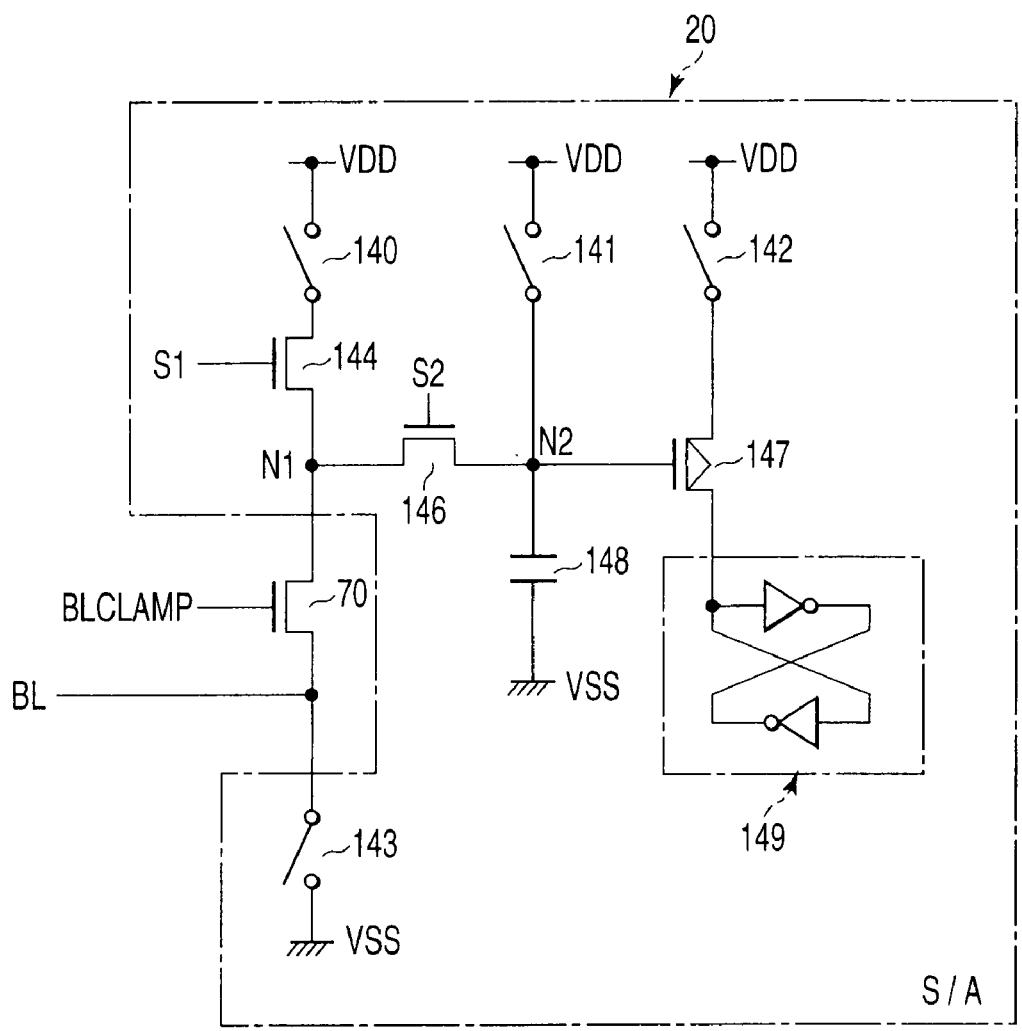

Now, description will be given of a semiconductor memory device according to a third embodiment of the present invention. The present embodiment relates to the configuration and operation of the sense amplifier 20 in the NAND flash memory according to the first and second embodiments. Only the sense amplifier 20 will be described below. The remaining parts of the configuration and operation are similar to those in the first and second embodiments. FIG. 10 is a circuit diagram showing an example of the configuration of the sense amplifier 20, used in the first and second embodiments.

As shown in FIG. 10, the sense amplifier 20 includes switch elements 140 to 143, n-channel MOS transistors 144 and 146, a p-channel MOS transistor 147, a capacitor element 148, and a latch circuit 149.

The MOS transistor 144 has a current path one end of which the voltage VDD is applied via the switch element 140. The other end of the current path is connected to a node N1. A signal S1 input to the gate of the MOS transistor 144. The node N1 is connected to the bit line BL via a current path of the MOS transistor 70. One end of a current path of the MOS transistor 146 is connected to a node N1 and the other end of the current path is connected to a node N2. A gate of the MOS transistor 146 is provided with a signal S2. The node N2 is provided with the voltage VDD via the switch element 141. One electrode of the capacitor element 148 is connected to the node N2 and the other electrode is provided with the voltage VSS. One end of a current path of the MOS transistor 147 is provided with the voltage VDD via the switch element 142 and the other end of the current path is connected to the latch circuit 149. A gate of the MOS transistor 147 is connected to the node N2. The switch element 143 connects the bit line BL to a voltage VSS node in accordance with data held in the latch circuit 149.

With reference to FIGS. 11 to 14, description will be given of a method of reading data using the sense amplifier 20 configured as described above. The state in which the memory cell transistor MT is turned on for data reading is hereinafter referred to as "1" reading. The state in which the memory cell transistor MT is off for data reading is hereinafter referred to as "0" reading. During the read operation, the signal S1 and S2 are set to (Vt+0.9 V) and (Vt+1.2 V), respectively. Vt denotes a threshold voltage for the MOS transistors 144 and 146. The signal BLCLAMP is set to (Vt+0.7 V). Vt denotes a threshold for the MOS transistor 70.

<"1" Reading>

Figure 11:
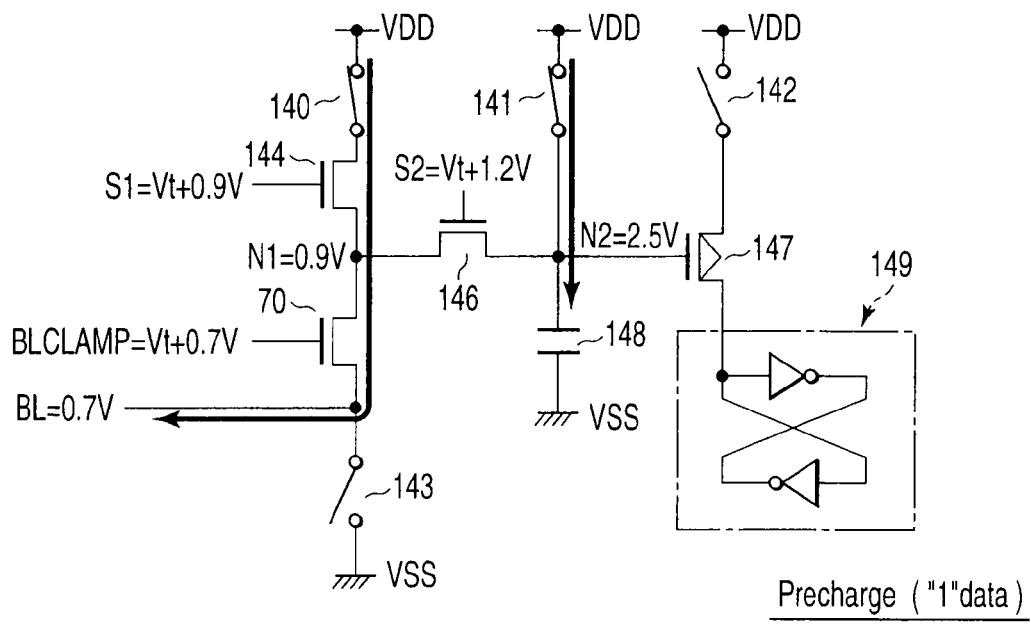

First, the "1" reading will be described. First, as shown in FIG. 11, the bit line BL is precharged. As shown in the figure, the switch element 140 is turned on. Then, since the NAND cell has been energized, current flows through the bit line via the switch element 140, the current path of the MOS transistor 144, node N1 and the current path of the MOS transistor 70. As a result, the potential of the bit line is set to about 0.7 V. That is, the potential of the bit line is fixed to 0.7 V, with current passed from the bit line BL to the source line SL. Furthermore, the switch element 141 is turned on to charge the capacitor element, setting the potential of the node N2 to about 2.5 V. The switch elements 142 and 143 are off.

Figure 12:
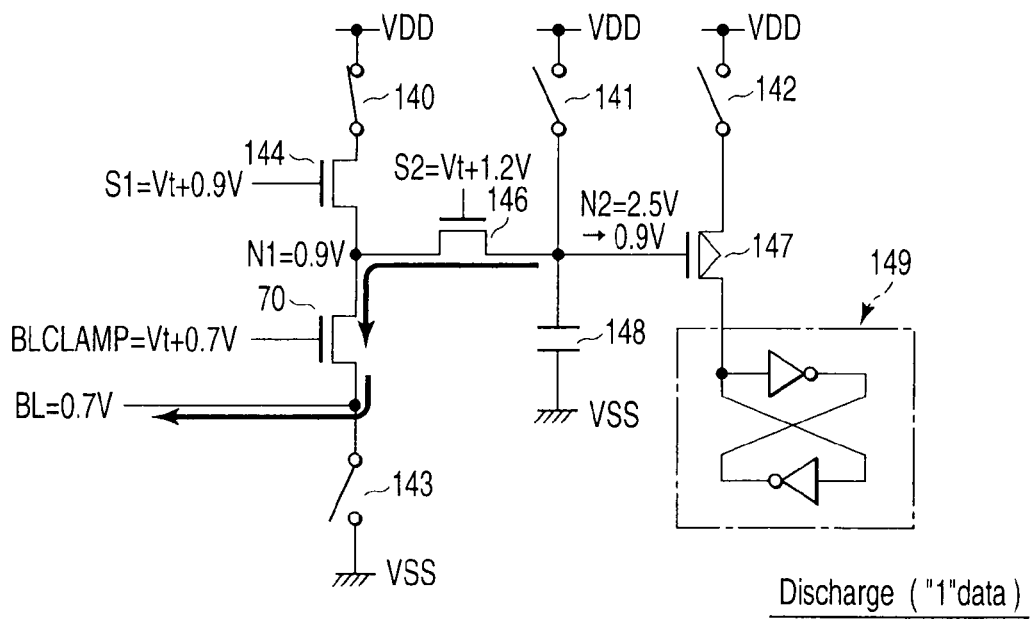

Then, as shown in FIG. 12, the node N2 is discharged. That is, the switch element 141 is turned off. The current flowing from the node N2 to the bit line BL then discharges the node N2, the potential of which lowers to about 0.9 V.

As shown in FIG. 13, the node N2 is continuously discharged. As shown in the figure, when the potential of the node N1 starts to lower to at most 0.9 V, the MOS transistor 144 starts to supply current. As a result, the potential of the node N1 is maintained at 0.9 V.

Then, as shown in FIG. 14, data is sensed. As shown in the figure, since the potential of the node N2 is 0.9 V, the MOS transistor 147 is turned on. The latch circuit 149 thus holds the voltage VDD. Since the latch circuit 149 holds VDD, the switch element 140 is off, and the switch element 143 is turned on. This sets the potential of the node N2 to 0 V. As a result, the latch circuit 149 continues to hold the voltage VDD. Furthermore, current flows from the bit line BL to the VSS node via the switch element 143, setting the potential of the bit line BL to VSS (0 V).

<"0" Reading>

Now, description will be given of the case in which the selected memory cell holds "0" data. In this case, no current flows through the bit line BL, the potential of which is thus fixed to 0.7 V. The potential of the node N2 is maintained at about 2.5 V. Consequently, the MOS transistor 147 is off, and the latch circuit 149 holds the voltage VSS (0 V). Thus, the switch element 140 is turned on, and the switch element 143 is off. The potential of the node N2 is maintained at 2.5 V, and the latch circuit 149 holds the voltage VSS.

As described above, the use of the sense amplifier described in the third embodiment exerts an effect (3) in addition to the effects (1) and (2), described in the first and second embodiments.

(3) The operation speed of the NAND flash memory can be increased (part 3).

The sensor amplifier 20 according to the present embodiment continues to pass current from the start of charging the bit line BL until the current is sensed. The current is thus sensed to read the data. Consequently, when the current is sensed, the potential of the bit line BL is 0 V (in the case of the "1" reading) or 0.7 V (in the case of the "0" reading); almost no variation occurs in the voltage. This eliminates the need to shield the adjacent bit line BL, enabling data to be simultaneously read from all the bit lines BL. This allows read speed to be increased.

Furthermore, the reading method involving current sensing performs reading while passing current through the bit line BL, resulting in a relatively significant variation in the potential of the source line SL. Thus, the operation shown in FIGS. 12 to 14 is desirably performed a number of times. That is, first, data is read from the memory cell transistors MT with the bit lines BL through which current flows easily. The read data is then confirmed. Data is then read from the remaining memory cell transistors MT while avoiding discharging the memory cell transistors MT with the data confirmed to reduce noise.

However, in the NAND flash memory according to the present embodiment, even with a significant variation in the potential of the source line SL, VBS (back gate-source voltage), VGS (gate-source voltage), and VDS (drain-source voltage) are almost fixed. This is because the back gate bias, the gate potential, and the drain potential vary in conjunction with the source potential. As a result, the data can be confirmed by a single reading operation for all the bit lines BL. This significantly improves the data reading operation.

As described above, the NAND flash memory according to the first to third embodiments of the present invention includes the plurality of memory cells formed on the semiconductor layer 102 and each having the charge accumulation layer 104 and the control gate 106 formed on the charge accumulation layer 104; the word line WL connected to the control gate 106 of each of the memory cells MT; the bit line BL electrically connected to the drain 107(D) of the memory cell MT; the source line SL electrically connected to the source 107(S) of the memory cell MT; and driver circuit 50 varying the potential of the semiconductor layer 102 in conjunction with the potential of the source line SL.

Consequently, the potential of the back gate of the memory cell transistor MT varies together with the potential of the source line SL. This makes it possible to inhibit possible erroneous reading even if the potential of the source line SL varies significantly.

In the embodiments, the NAND flash memory has been described by way of example. However, the above embodiments are not limited to the NAND flash memory but is widely applicable to, for example, other flash memories such as NOR flash memories or semiconductor memories in general other than the flash memories. Furthermore, in the description of the embodiments, each of the memory cell transistors MT holds 3-bit data. However, the memory cell transistor MT may hold 1-, 3-, or 4-bit data. The effects of the above-described embodiments are particularly enhanced by increasing the number of bits.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor memory device comprising:
a first semiconductor layer provided in a surface area of a semiconductor substrate;
a first memory cell array formed on the first semiconductor layer and having a plurality of first memory cells including a charge accumulation layer and a control gate;
a second semiconductor layer provided in a surface area of the semiconductor substrate and electrically separated from the first semiconductor layer;
a second memory cell array formed on the second semiconductor layer and having a plurality of second memory cells including a charge accumulation layer and a control gate; and
a driver circuit which independently controls potentials of the first semiconductor layer and the second semiconductor layer, the driver circuit applying erase voltages to the first and second semiconductor layers during an erase operation, wherein
the erase voltages for the first and second semiconductor layers are controlled by separate control signals independently, and are applied to the first and second semiconductor layers.

2. The device according to claim 1, further comprising
a first word line connected to the control gate of the first memory cell;
a first bit line electrically connected to a drain of the first memory cell;
a first source line electrically connected to a source of the first memory cell;
a second word line connected to the control gate of the second memory cell;
a second bit line electrically connected to a drain of the second memory cell; and
a second source line electrically connected to a source of the second memory cell, wherein
the driver circuit varies potential of the first semiconductor layer in conjunction with potential of the first source line and varies potential of the second semiconductor layer in conjunction with potential of the second source line.

3. The device according to claim 2, wherein
the driver circuit short-circuits the first semiconductor layer and the first source line when data is read from the first memory cell, and
short-circuits the second semiconductor layer and the second source line when data is read from the second memory cell.

4. The device according to claim 2, wherein
the driver circuit makes the potential of the first semiconductor layer equal to the potential of the first source line finally reached by current flowing from the first memory cell to the first source line when data is read from the first memory cell, and
makes the potential of the second semiconductor layer equal to the potential of the second source line finally reached by current flowing from the second memory cell to the second source line when data is read from the second memory cell.

5. The device according to claim 2, wherein the driver circuit comprises:
a first switch element which connects the first semiconductor layer to the first source line when data is read from the first memory cell;
a second switch element which connects the second semiconductor layer to the second source line when data is read from the second memory cell;
a third switch element which connects the first semiconductor layer to a first potential node then data is written to the first memory cell;
a fourth switch element which connects the second semiconductor layer to the first potential node when data is written to the second memory cell;
a fifth switch element which connects the first semiconductor layer to a second potential node having a higher positive potential than the first potential node when data is erased from the first memory cell; and
a sixth switch element which connects the second semiconductor layer to the second potential node when data is erased from the second memory cell.

6. The device according to claim 2, further comprising:
a bit line driver which varies potentials of the first and second bit lines in conjunction with the first and second source lines, respectively.

7. The device according to claim 2, further comprising:
a word line driver which varies potentials of the first and second word lines in conjunction with the first and second source lines, respectively.

8. The device according to claim 2, wherein each of the first and second memory cells is configured to hold data of at least 3 bits depending on a threshold voltage.

9. The device according to claim 2, further comprising:
a first select transistor and a second select transistor which are formed on the first semiconductor layer; and
a third select transistor and a fourth select transistor which are formed on the second semiconductor layer, wherein
the plurality of first memory cells are connected in series between a source of the first select transistor and a drain of the second select transistor,
the first bit line is connected to a drain of the first select transistor,
the first source line is connected to a source of the second select transistor,
the plurality of second memory cells are connected in series between a source of the third select transistor and a drain of the fourth select transistor,
the second bit line is connected to a drain of the third select transistor, and
the second source line is connected to a source of the fourth select transistor.

10. The device according to claim 2, further comprising:
a first sense amplifier and a second sense amplifier which read the data from the first and second memory cells, respectively, wherein
the first and second sense amplifiers continuously flow current to the first and second bit lines, respectively, during the data reading.

11. The device according to claim 2, wherein
the second bit line is electrically isolated from the first bit line.

12. A semiconductor memory device comprising:
a first semiconductor layer provided in a surface area of a semiconductor substrate;
a first memory cell array formed on the first semiconductor layer and having a plurality of first memory cells including a charge accumulation layer and a control gate;
a second semiconductor layer provided in a surface area of the semiconductor substrate and electrically separated from the first semiconductor layer;
a second memory cell array formed on the second semiconductor layer and having a plurality of second memory cells including a charge accumulation layer and a control gate; and
a driver circuit which independently controls potentials of the first semiconductor layer and the second semiconductor layer, the driver circuit applying erase voltage to one of the first and second semiconductor layers in erase operation, without applying the erase voltage to other of the first and second semiconductor layers.

13. The device according to claim 12, further comprising:
a first word line connected to the control gate of the first memory cell;
a first bit line electrically connected to a drain of the first memory cell;
a first source line electrically connected to a source of the first memory cell;
a second word line connected to the control gate of the second memory cell;
a second bit line electrically connected to a drain of the second memory cell; and
a second source line electrically connected to a source of the second memory cell, wherein
the driver circuit varies potential of the first semiconductor layer in conjunction with potential of the first source line and varies potential of the second semiconductor layer in conjunction with potential of the second source line.

14. The device according to claim 13, wherein
the driver circuit short-circuits the first semiconductor layer and the first source line when data is read from the first memory cell, and
short-circuits the second semiconductor layer and the second source line when data is read from the second memory cell.

15. The device according to claim 13, wherein
the driver circuit makes the potential of the first semiconductor layer equal to the potential of the first source line finally reached by current flowing from the first memory cell to the first source line when data is read from the first memory cell, and
makes the potential of the second semiconductor layer equal to the potential of the second source line finally reached by current flowing from the second memory cell to the second source line when data is read from the second memory cell.

16. The device according to claim 13, wherein the driver circuit comprises:
a first switch element which connects the first semiconductor layer to the first source line when data is read from the first memory cell;

a second switch element which connects the second semiconductor layer to the second source line when data is read from the second memory cell;
a third switch element which connects the first semiconductor layer to a first potential node then data is written to the first memory cell;
a fourth switch element which connects the second semiconductor layer to the first potential node when data is written to the second memory cell;
a fifth switch element which connects the first semiconductor layer to a second potential node having a higher positive potential than the first potential node when data is erased from the first memory cell; and
a sixth switch element which connects the second semiconductor layer to the second potential node when data is erased from the second memory cell.

17. The device according to claim 13, further comprising:
a bit line driver which varies potentials of the first and second bit lines in conjunction with the first and second source lines, respectively.

18. The device according to claim 13, further comprising:
a word line driver which varies potentials of the first and second word lines in conjunction with the first and second source lines, respectively.

19. The device according to claim 13, further comprising:
a first select transistor and a second select transistor which are formed on the first semiconductor layer; and
a third select transistor and a fourth select transistor which are formed on the second semiconductor layer, wherein
the plurality of first memory cells are connected in series between a source of the first select transistor and a drain of the second select transistor,
the first bit line is connected to a drain of the first select transistor,
the first source line is connected to a source of the second select transistor,
the plurality of second memory cells are connected in series between a source of the third select transistor and a drain of the fourth select transistor,
the second bit line is connected to a drain of the third select transistor, and
the second source line is connected to a source of the fourth select transistor.

20. The device according to claim 13, wherein the second bit line is electrically isolated from the first bit line.

* * * * *